US005508964A

United States Patent [19]

Toops

[11] Patent Number: 5,508,964

[45] Date of Patent: Apr. 16, 1996

[54] WRITE RECOVERY TIME MINIMIZATION FOR BI-CMOS SRAM

[75] Inventor: David J. Toops, Mesquite, Tex.

[73] Assignee: Texas Instruments Incorporated, Dallas, Tex.

[21] Appl. No.: 1,996

[22] Filed: Jan. 8, 1993

[51] Int. Cl.[6] .......................... G11C 7/00

[52] U.S. Cl. .......................... 365/203; 365/184.01; 365/204

[58] Field of Search .......................... 365/203, 189.01, 365/190, 204

[56] References Cited

U.S. PATENT DOCUMENTS

| | | | |
|---|---|---|---|
| 4,236,229 | 11/1980 | Caudel | 365/203 |
| 4,656,608 | 4/1987 | Aoyama | 365/203 |
| 4,866,673 | 9/1989 | Tran | 365/203 |
| 4,926,383 | 5/1990 | Kertis et al. | 365/203 |
| 4,928,268 | 5/1990 | Nogle et al. | 365/203 |
| 4,939,693 | 7/1990 | Tran | 365/190 |
| 4,975,877 | 12/1990 | Bell | 365/189.01 |
| 5,075,891 | 12/1991 | Yano et al. | 365/190 |
| 5,091,889 | 2/1992 | Hamano et al. | 365/203 |
| 5,155,703 | 10/1992 | Nogle | 365/203 |

FOREIGN PATENT DOCUMENTS

| | | | |
|---|---|---|---|
| 0031462 | 7/1981 | European Pat. Off. | 365/203 |

*Primary Examiner*—Eugene R. LaRoche
*Assistant Examiner*—Tan Nguyen
*Attorney, Agent, or Firm*—Ronald O. Neerings; James C. Kesterson; Richard L. Donaldson

[57] ABSTRACT

A circuit and method for minimizing write recovery time in a Bi-CMOS SRAM by equalizing the bit-line voltages during a read access. A P-channel device whose drain, source and gate are connected to bit, bit-bar, and the write control signal, respectively, indirectly equalizes the bit-lines by equalizing the base voltages of the NPN bit-line load devices only when the column is selected for read access. This technique takes advantage of the current gain of the NPN transistor from the base to the emitter to provide fast bit-line equalization immediately following writes, thus minimizing the write recovery time.

18 Claims, 1 Drawing Sheet

WRITE RECOVERY TIME MINIMIZATION FOR BI-CMOS SRAM

FIELD OF THE INVENTION

The present invention relates to the field of integrated circuit devices. More specifically, the present invention relates to a circuit and method for reducing the write recovery time in a Bi-CMOS SRAM.

BACKGROUND OF THE INVENTION

Many existing Static Random Access Memory devices (SRAMs) share a common problem of slow access time whenever a read follows a write in the same column. A schematic diagram of one column of a typical Bi-CMOS SRAM is shown in FIG. 1. Devices Q1 and Q2 are the bit-line load devices which bias the bit-lines near VCC. Devices R1 and R2 are bit-line load resistors which set the voltage swing on the bit-lines during a read access.

Devices G1 and G2 disable Q1 or Q2 during a write. During a read, the bases of Q1 and Q2 are driven to VCC. During a write, one of the bit-lines is driven to GND, while the other is left near VCC. Because of this, a read following a write in the same column requires additional time (as compared to consecutive reads) for the bit-lines to be equalized before the state of the accessed memory bit can be sensed. What is needed is a method for reducing the write recovery time.

SUMMARY OF THE INVENTION

The present invention disclosed herein comprises a circuit for minimizing write recovery time in a Bi-CMOS SRAM by equalizing bit-line voltages during a read access. A P-channel device whose drain, source and gate are connected to bit, bit-bar, and the write control signal, respectively, indirectly equalizes the bit-lines by equalizing the base voltages of the NPN bit-line load devices only when the column is selected for read access. This technique takes advantage of the current gain of the NPN transistor from the base to the emitter to provide fast bit-line equalization immediately following writes, thus minimizing the write recovery time.

BRIEF DESCRIPTION OF THE DRAWINGS

The novel features believed characteristic of the invention are set forth in the appended claims. The invention itself, however as well as other features and advantages thereof, will be best understood by reference to the detailed description which follows, read in conjunction with the accompanying drawings, wherein:

DETAILED DESCRIPTION OF THE INVENTION

Figure 1:
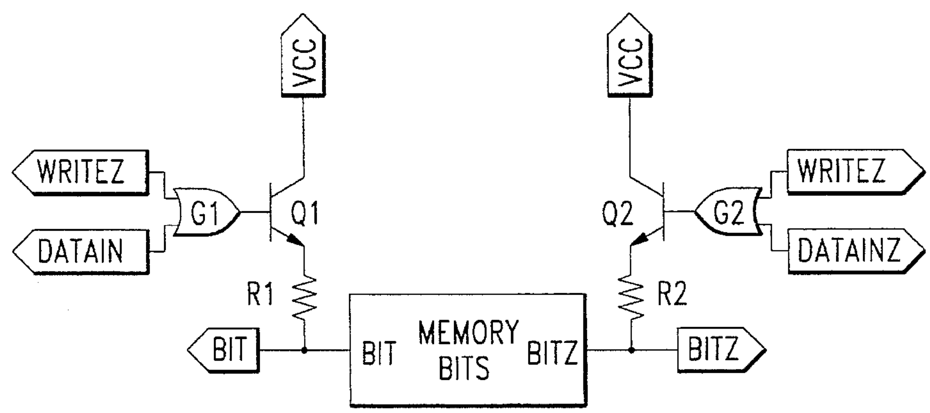
FIG. 1 is a schematic diagram of one column of a typical Bi-CMOS SRAM.
Figure 2:
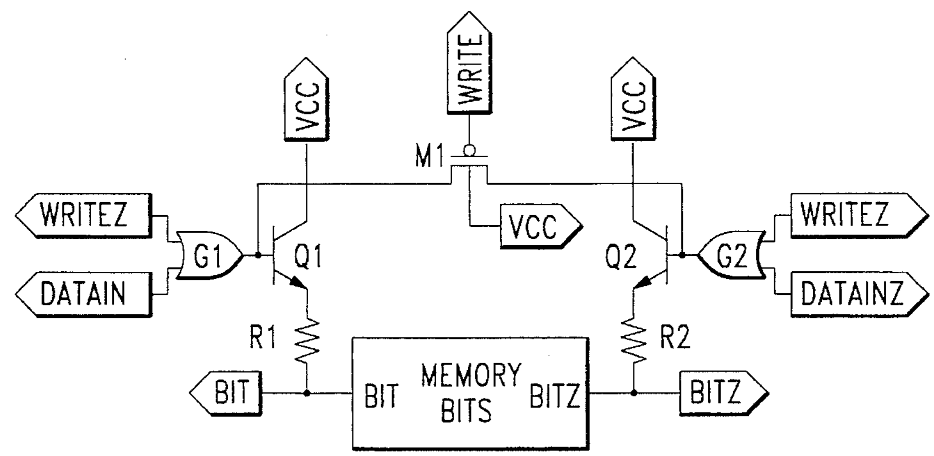
FIG. 2 is a schematic diagram of one column of a Bi-CMOS SRAM according to a preferred embodiment of the invention.

FIG. 2 is a schematic diagram of one column of a Bi-CMOS SRAM according to a preferred embodiment of the invention. Device Q1 is a transistor having its collector connected to VCC and its emitter connected to a lead of resistor R1. The base of the transistor is connected to the output of OR gate G1. A first input of OR gate G1 is connected to a write line (WRITEZ). A second input of OR gate G1 is connected to a data line (DATAIN). A second lead of resistor R1 is connected to a bit-line (BIT).

Device Q2 is a transistor having its collector connected to VCC and its emitter connected to a lead of resistor R2. The base of the transistor is connected to the output of OR gate G2. A first input of OR gate G2 is connected to a write line (WRITEZ). A second input of OR gate G2 is connected to a data line (DATAINZ). A second lead of resistor R2 is connected to a bit-line (BITZ).

Device M1 is a P-channel transistor having one current handling terminal connected to the base of transistor Q1, the other current handling terminal connected to the base of transistor Q2, the substrate connected to VCC and the control terminal connected to a write line (WRITE).

Devices Q1 and Q2 are the bit-line load devices that bias the bit-lines near VCC. Devices R1 and R2 are bit-line load resistors that set the voltage swing on the bit-lines during a read access. Devices G1 and G2 disable Q1 or Q2 during a write. During a read, the bases of Q1 and Q2 are driven to VCC.

Device M1 provides bit-line equalization by equalizing the bases of Q1 and Q2 when the column is selected for read access. By equalizing the bases of Q1 and Q2, the emitters of Q1 and Q2 are also equalized, providing equalization of the bit-lines.

The main advantage of this technique over related art is it provides bit-line equalization in a read following a write in the same column. During a write, one of the bit-lines is driven to GND, while the other is left near VCC. Because of this, a read following a write in the same column requires additional time (as compared to consecutive reads in the same column) for the bit-lines to be equalized before the state of the accessed memory bit can be sensed. This write recovery time is minimized by using device M1. This technique takes advantage of the current gain of the NPN transistor (Q1 or Q2) from the base to the emitter to accomplish the bit-line equalization. Moreover, the gate of device M1 is controlled by the write signal directly, a readily available signal.

Figure 3:
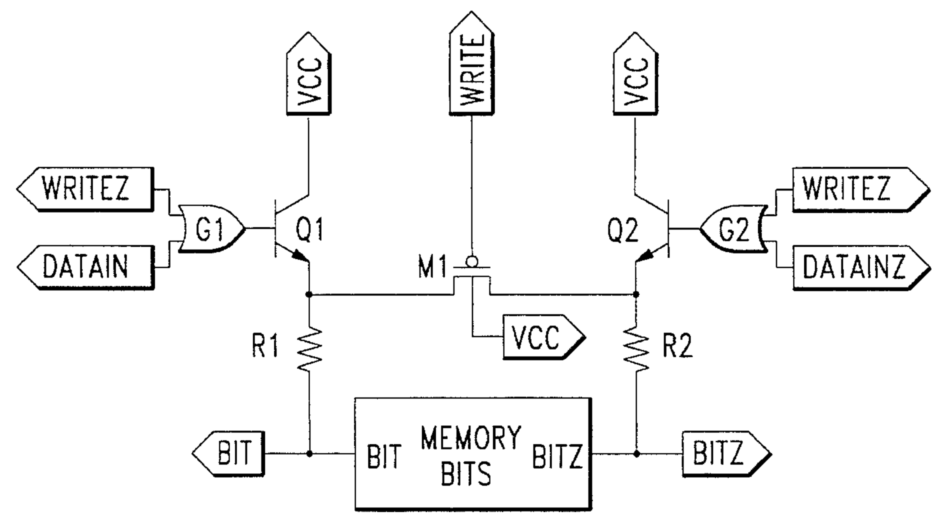
FIG. 3 is a schematic diagram of one column of a Bi-CMOS SRAM according to another embodiment of the invention.

In another embodiment of the invention, shown in FIG. 3, one current handling terminal of device M1 is connected to the emitter of transistor Q1, the other current handling terminal is connected to the emitter of transistor Q2, the substrate is connected to VCC and the control terminal is connected to a write line (WRITE). This embodiment of the invention does not take advantage of the current gain of the NPN transistor (Q1 or Q2) from base to emitter. Thus, this embodiment of the invention provides an improvement in write recovery time over related art circuitry, but not as good as the improvement in write recovery time available with the preferred embodiment of the invention.

While this invention has been described with reference to illustrative embodiments, this description is not to be construed in a limiting sense. Various modifications to the illustrative embodiments, as well as other embodiments of the invention will be apparent to persons skilled in the art upon reference to this description. It is therefore contemplated that the appended claims will cover any such modifications or embodiments as fall within the true scope of the invention.

What is claimed:

1. A semiconductor device, comprising:

a first bit line and a second bit line;

a first bit line load resistor coupling said first bit line to a first bit line load device;

a second bit line load resistor coupling said second bit line to a second bit line load device; and a transistor, for providing equalization of said bit lines in response to a read access signal, having a first current handling terminal connected to said first bit line load device and not directly connected to said first bit line, a second current handling terminal connected to said second bit line load device and not directly connected to said second bit line, and a control terminal coupled to receive a write control signal.

2. The semiconductor device of claim 1 in which said first bit line load device is a transistor.

3. The semiconductor device of claim 2 in which said transistor is a bi-polar transistor.

4. The semiconductor device of claim 3 in which said transistor is an NPN transistor having a collector connected to VCC, an emitter connected to said first bit line load resistor and a base connected to a first device that drives said base to VCC in response to a read signal.

5. The semiconductor device of claim 4 in which said first device is an OR gate having an output connected to said base of said transistor of said first bit line load device, a first input coupled to receive a write signal and a second input coupled to receive a first data or read signal.

6. The semiconductor device of claim 1 in which said second bit line load device is a transistor.

7. The semiconductor device of claim 6 in which said transistor is a bi-polar transistor.

8. The semiconductor device of claim 7 in which said transistor is an NPN transistor having a collector connected to VCC, an emitter connected to said second bit line load resistor and a base connected to a second device that drives said base to VCC in response to a read signal.

9. The semiconductor device of claim 8 in which said second device is an OR gate having an output connected to said base of said transistor of said second bit line load device, a first input coupled to receive a write signal and a second input coupled to receive a second data or read signal.

10. The semiconductor device of claim 1 in which said first bit line load device is a first transistor and said second bit line load device is a second transistor.

11. The semiconductor device of claim 10 in which said first transistor and said second transistor are bi-polar transistors.

12. The semiconductor device of claim 11 in which said first transistor is an NPN transistor having a collector connected to VCC, an emitter connected to said first bit line load resistor and a base connected to a first device that drives said base to VCC in response to a read signal and said second transistor is an NPN transistor having a collector connected to VCC, an emitter connected to said second bit line load resistor and

13. The semiconductor device of claim 12 in which said first device is an OR gate having an output connected to said base of said first transistor of said first bit line load device, a first input coupled to receive a write signal and a second input coupled to receive a first data or read signal and said second device is an OR gate having an output connected to said base of said second transistor of said second bit line load device, a first input coupled to receive a write signal and a second input coupled to receive a second data or read signal.

14. The semiconductor device of claim 13 in which said transistor has a first current handling terminal connected to the gate of said first transistor, a second current handling terminal connected to said gate of said second transistor and a control terminal coupled to receive a write signal.

15. The semiconductor device of claim 1 in which said transistor is a P-channel transistor, said first current handling terminal is one of a source/drain of said transistor, said second current handling terminal is the other of the source/drain of said transistor, said control terminal is the gate of said transistor.

16. The semiconductor device of claim 15 in which said transistor is a Bi-CMOS transistor with the substrate connected to VCC.

17. The semiconductor device of claim 1 in which said transistor is a P-channel transistor, said first current handling terminal is one of a source/drain of said transistor, said second current handling terminal is the other of the source/drain of said transistor and said control terminal is the gate of said transistor.

18. A method of making a semiconductor device, comprising:

forming a first bit line and a second bit line;

forming a first bit line load resistor coupling said first bit line to a first bit line load device;

forming a second bit line load resistor coupling said second bit line to a second bit line load device; and forming a transistor, for providing equalization of said bit lines in response to a read access signal, having a first current handling terminal connected to said first bit line load device and not directly connected to said first bit line, a second current handling terminal connected to said second bit line load device and not directly connected to said second bit line, and a control terminal coupled to receive a write control signal.

* * * * *